(12) United States Patent
Kim et al.

(10) Patent No.: US 12,154,950 B2
(45) Date of Patent: Nov. 26, 2024

(54) TRANSISTOR, TERNARY INVERTER COMPRISING SAME, AND TRANSISTOR MANUFACTURING METHOD

(71) Applicant: UNIST (ULSAN NATIONAL INSTITUTE OF SCIENCE AND TECHNOLOGY), Ulsan (KR)

(72) Inventors: Kyung Rok Kim, Ulsan (KR); Ji Won Chang, Ulsan (KR); Jae Won Jeong, Ulsan (KR); Youngeun Choi, Ulsan (KR); Wooseok Kim, Ulsan (KR)

(73) Assignee: UNIST (ULSAN NATIONAL INSTITUTE OF SCIENCE AND TECHNOLOGY) (KR)

( * ) Notice: Subject to any disclaimer, the term of this patent is extended or adjusted under 35 U.S.C. 154(b) by 164 days.

(21) Appl. No.: 17/636,342

(22) PCT Filed: Nov. 19, 2020

(86) PCT No.: PCT/KR2020/016415
§ 371 (c)(1),
(2) Date: Feb. 17, 2022

(87) PCT Pub. No.: WO2021/137432
PCT Pub. Date: Jul. 8, 2021

(65) Prior Publication Data
US 2022/0285497 A1  Sep. 8, 2022

(30) Foreign Application Priority Data

Dec. 30, 2019  (KR) .......................... 10-2019-0178518
Jul. 14, 2020  (KR) .......................... 10-2020-0087154

(51) Int. Cl.
*H01L 29/78*   (2006.01)
*H01L 27/092*  (2006.01)
(Continued)

(52) U.S. Cl.
CPC ...... *H01L 29/1083* (2013.01); *H01L 27/0928* (2013.01); *H01L 29/6684* (2013.01); *H01L 29/78391* (2014.09)

(58) Field of Classification Search
CPC ............ H01L 29/1083; H01L 27/0928; H01L 29/6684; H01L 29/78391; H01L 27/0727;
(Continued)

(56) References Cited

U.S. PATENT DOCUMENTS 7,202,131 B2   4/2007  Bang
7,960,222 B1 * 6/2011  Kwon ................. H01L 27/0928
                                          438/341

(Continued)

FOREIGN PATENT DOCUMENTS

KR   20050070932 A    7/2005
KR   20060110702 A   10/2006
(Continued)

OTHER PUBLICATIONS

International Search Report and Written Opinion for PCT/KR2020/016415, mailed Feb. 25, 2021.
(Continued)

*Primary Examiner* — Sheikh Maruf
(74) *Attorney, Agent, or Firm* — Klarquist Sparkman, LLP

(57) ABSTRACT

Provided is a transistor including: a constant current formation layer; a channel layer provided on the constant current formation layer; a pair of source/drain regions spaced apart from each other, with the channel layer therebetween on the constant current formation layer; a gate electrode provided on the channel layer; and a gate ferroelectric film provided between the gate electrode and the channel layer.

12 Claims, 16 Drawing Sheets

(51) Int. Cl.
   *H01L 29/10*    (2006.01)
   *H01L 29/66*    (2006.01)
(58) Field of Classification Search
   CPC ........... H01L 21/823892; H01L 27/092; H01L 29/516; H03K 19/09425; H03K 19/20
   USPC ......................................................... 257/295
   See application file for complete search history.

(56) References Cited

U.S. PATENT DOCUMENTS

| | | | |
|---|---|---|---|
| 9,484,924 B2 | 11/2016 | Shin et al. | |
| 9,876,018 B2 | 1/2018 | Chavan et al. | |
| 10,133,550 B2 | 11/2018 | Kim et al. | |
| 2003/0164511 A1* | 9/2003 | Kaneko | H01L 27/0222 |
| | | | 257/215 |
| 2004/0033666 A1* | 2/2004 | Williams | H01L 21/761 |
| | | | 438/297 |
| 2006/0197149 A1* | 9/2006 | Fujimoto | H01L 27/0928 |
| | | | 257/E29.054 |
| 2006/0240622 A1* | 10/2006 | Lee | H01L 29/785 |
| | | | 438/257 |
| 2008/0173948 A1* | 7/2008 | Ma | H01L 27/0928 |
| | | | 257/E27.092 |
| 2008/0290410 A1* | 11/2008 | Huang | H01L 27/0928 |
| | | | 257/E29.256 |
| 2011/0180878 A1* | 7/2011 | Tai | H01L 27/0928 |
| | | | 257/E27.06 |
| 2012/0080754 A1* | 4/2012 | Ema | H01L 27/0928 |
| | | | 257/E21.409 |
| 2012/0112278 A1* | 5/2012 | Loechelt | H01L 21/823814 |
| | | | 257/E29.256 |
| 2012/0112291 A1* | 5/2012 | Yanagi | H01L 29/1083 |
| | | | 257/E21.546 |
| 2012/0248548 A1* | 10/2012 | Loechelt | H01L 29/66689 |
| | | | 257/E27.061 |
| 2014/0091399 A1* | 4/2014 | Loechelt | H01L 29/6625 |
| | | | 257/392 |
| 2015/0340372 A1* | 11/2015 | Pandey | H10B 51/30 |
| | | | 257/295 |
| 2016/0207761 A1* | 7/2016 | Alam | H01L 27/0805 |
| 2018/0074788 A1* | 3/2018 | Kim | H03K 19/20 |
| 2018/0102374 A1* | 4/2018 | Chavan | H01L 29/4966 |
| 2018/0204841 A1* | 7/2018 | Yamaji | H01L 29/7817 |
| 2019/0109193 A1* | 4/2019 | Liaw | H01L 29/7848 |
| 2019/0363094 A1* | 11/2019 | Lo | H01L 27/0928 |
| 2019/0371939 A1* | 12/2019 | Wang | H01L 21/823814 |
| 2020/0373314 A1* | 11/2020 | Chavan | H10B 53/30 |
| 2021/0257457 A1* | 8/2021 | Sung | H01L 29/785 |
| 2021/0265343 A1* | 8/2021 | Ching | H01L 29/775 |
| 2021/0305390 A1* | 9/2021 | Lee | H01L 21/0262 |
| 2022/0157666 A1* | 5/2022 | Bi | H01L 21/823807 |

FOREIGN PATENT DOCUMENTS

| | | |
|---|---|---|
| KR | 20160089141 A | 7/2016 |
| KR | 101689159 B1 | 12/2016 |
| KR | 20180076369 A | 7/2018 |

OTHER PUBLICATIONS

Jeong, J. et al., "Tunnelling-based ternary metal-oxide-semiconductor technology," *Natural Electronics,* 2:307-312 (Jul. 2019).

Kim, K. et al., "Multi-Valued Logic Device Technology; Overview, Status, and Its Future for Peta-Scale Information Density," *Journal of Semiconductor Engineering,* 1(1):57-63 (Jun. 2020).

Notice of Allowance for Korean Patent Application No. 10-2020-0087154, mailed Nov. 25, 2021 (w/English translation).

Office Action for Korean Patent Application No. 10-2020-0087154, mailed Aug. 3, 2021 (w/English translation).

* cited by examiner

TRANSISTOR, TERNARY INVERTER COMPRISING SAME, AND TRANSISTOR MANUFACTURING METHOD

CROSS REFERENCE TO RELATED APPLICATIONS

This is the U.S. National Stage of International Application No. PCT/KR2020/016415, filed Nov. 19, 2020, which in turn claims priority to Korean Patent Application No. 10-2019-0178518, filed Dec. 30, 2019, and Korean Patent Application No. 10-2020-0087154, filed Jul. 14, 2020, which applications are incorporated herein in their entireties.

TECHNICAL FIELD

The present disclosure relates to a project entitled "advanced concept ternary CMOS device technology and power-saving neural network standard cell implementation for peta-level connection" funded by Samsung Electronics Co., Ltd. under the project identification no. SRFC-TA1703-07.

The present disclosure relates to a transistor, a ternary inverter, and a manufacturing method of the transistor.

BACKGROUND ART

The digital systems based on the binary logic in related arts have focused on increasing the bit density through miniaturization of complementary metal oxide semiconductor (CMOS) devices to process a large volume of data faster. However, the recent tendency of integration less than or equal to 30-nm has posed limitation on the increase of bit density due to the generation of leakage currents and the increase in power consumption caused by the quantum tunneling effect. To overcome such limitation on the bit density, there has been a growing interest in ternary logic devices and circuits, which are based on the multi-valued logic, and in particular, a standard ternary inverter (STI) has been actively developed as a standard unit for implementing the ternary logic. However, unlike the conventional binary inverters using one voltage source and two CMOSs, the existing technologies regarding the STI require more voltage sources or more complex circuit configuration.

DESCRIPTION OF EMBODIMENTS

Technical Problem

The present disclosure aims to provide a transistor having a constant current.

The present disclosure aims to provide a ternary inverter having a constant current and three states.

The present disclosure aims to provide a method of manufacturing a transistor having a constant current.

However, the technical objectives of the present disclosure are not limited thereto.

Solution to Problem

According to an aspect of an embodiment, a transistor includes: a constant current formation layer; a channel layer provided on the constant current formation layer; a pair of source/drain regions spaced apart from each other, with the channel layer therebetween; a gate electrode provided on the channel layer; and a gate ferroelectric film provided between the gate electrode and the channel layer.

The transistor may further include a gate dielectric film provided between the gate electrode and the gate ferroelectric film.

The constant current formation layer may form a constant current between the constant current formation layer and a source/drain region, which is a drain, of the pair of source/drain regions.

The constant current may be independent of a gate voltage applied to the gate electrode.

The constant current formation layer and the channel layer may have a first conductivity type, and a doping concentration of the constant current formation layer may be higher than a doping concentration of the channel layer.

The doping concentration of the constant current formation layer may be greater than or equal to $3\times10^{18}$ cm$^{-3}$.

An electric field may be formed between the constant current formation layer and the source/drain region, which is a drain, of the pair of source/drain regions, and an intensity of the electric field may be greater than or equal to $10^6$ V/cm.

According to an aspect of an embodiment, a ternary inverter includes: a first well region and a second well region; a first constant current formation layer and a second constant current formation layer provided on the first well region and the second well region, respectively; a first channel layer and a second channel layer provided on the first constant current formation layer and the second constant current formation layer, respectively; a first gate structure and a second gate structure provided on the first channel layer and the second channel layer, respectively; a first pair of source/drain regions spaced apart from each other with the first channel layer therebetween on the first constant current formation layer; and a second pair of source/drain regions spaced apart from each other with the second channel layer therebetween on the second constant current formation layer, wherein each of the first gate structure and the second gate structure includes a gate ferroelectric film and a gate electrode stacked in this stated order.

The first gate structure and the second gate structure may respectively further include a gate dielectric film provided between the gate electrode and the gate ferroelectric film.

The first constant current formation layer may form a first constant current between the first constant current formation layer and a source/drain region, which is a drain, of the first pair of source/drain regions, and the second constant current formation layer may form a second constant current between the second constant current formation layer and a source/drain region, which is a drain, of the second pair of source/drain regions.

The first constant current and the second constant current may be independent of gate voltages applied to the gate electrode of the first gate structure and the gate electrode of the second gate structure, respectively.

The first constant current formation layer and the second constant current formation layer may have a conductivity type same as that of the first channel layer and the second channel layer, respectively, and doping concentrations of the first constant current formation layer and the second constant current formation layer may be higher than a doping concentration of the first channel layer and the second channel layer, respectively.

The doping concentration of the first constant current formation layer and the doping concentration of the second constant current formation layer may be greater than or equal to $3\times10^{18}$ cm$^{-3}$.

An electric field greater than or equal to $10^6$ V/cm may be formed between the source/drain region, which is a drain, of the first pair of source/drain regions and the first constant current formation layer, and an electric field greater than or equal to $10^6$ V/cm may be formed between the source/drain region, which is a drain, of the second pair of source/drain regions and the second constant current formation layer.

According to an aspect of an embodiment, a method of manufacturing a transistor includes: providing a constant current formation layer; forming a channel layer on the constant current formation layer; forming a gate ferroelectric film on the channel layer; forming a gate electrode on the channel layer; and forming a source region and a drain region in the channel layer, wherein the source region and the drain region are spaced apart from each other, with the gate electrode therebetween.

The method may further include forming a gate dielectric film between the gate ferroelectric film and the gate electrode.

The channel layer and the constant current formation layer may have the same conductivity type, and the doping concentration of the constant current formation layer may be greater than or equal to $3\times10^{18}$ cm$^{-3}$.

An electric field may be formed between the drain region and the constant current formation layer, and an intensity of the electric field may be greater than or equal to $10^6$ V/cm.

The constant current formation layer may be formed by an epitaxial growth process.

The constant current formation layer may form a constant current between the drain region and the constant current formation layer, and the constant current may be independent of a gate voltage applied to the gate electrode.

Advantageous Effects of Disclosure

Provided is a transistor having a constant current.

Provided is a method of manufacturing a transistor having a constant current.

Provided is a ternary inverter having an independent constant current and three states.

However, the effects of the present disclosure are not limited thereto.

BEST MODE

Figure 1:
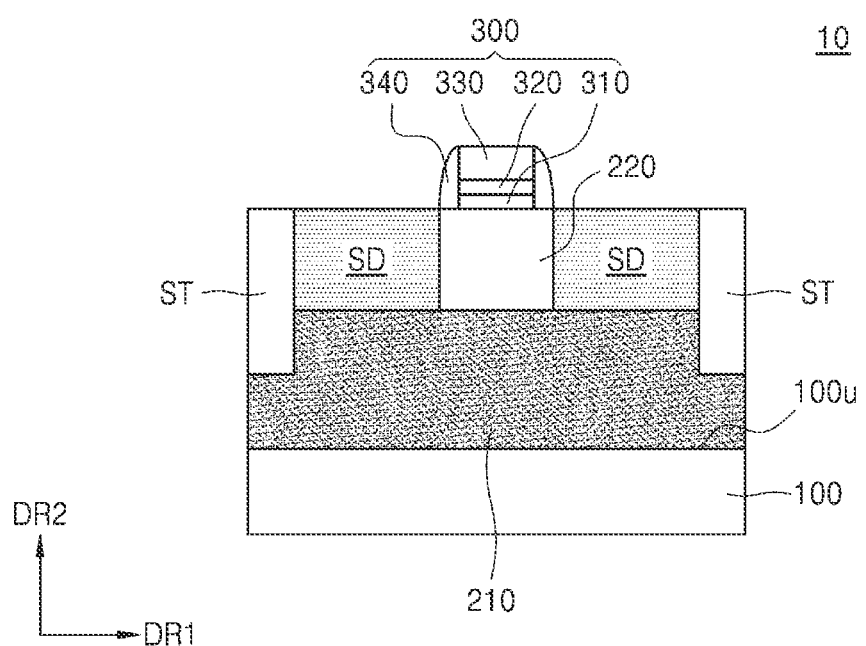
FIG. 1 is a cross-section view of a transistor according to example embodiments.

According to an aspect of an embodiment, a transistor includes: a constant current formation layer; a channel layer provided on the constant current formation layer; a pair of source/drain regions spaced apart from each other, with the channel layer therebetween; a gate electrode provided on the channel layer; and a gate ferroelectric film provided between the gate electrode and the channel layer.

According to an aspect of an embodiment, a ternary inverter includes: a first well region and a second well region; a first constant current formation layer and a second constant current formation layer provided on the first well region and the second well region, respectively; a first channel layer and a second channel layer provided on the first constant current formation layer and the second constant current formation layer, respectively; a first gate structure and a second gate structure provided on the first channel layer and the second channel layer, respectively; a first pair of source/drain regions spaced apart from each other, with the first channel layer therebetween on the first constant current formation layer; and a second pair of source/drain regions spaced apart from each other, with the second channel layer therebetween on the second constant current formation layer, wherein each of the first gate structure and the second gate structure includes a gate ferroelectric film and a gate electrode stacked in this stated order.

According to an aspect of an embodiment, a method of manufacturing a transistor includes: providing a constant current formation layer; forming a channel layer on the constant current formation layer; forming a gate ferroelectric film on the channel layer; forming a gate electrode on the channel layer; and forming a source region and a drain region in the channel layer, wherein the source region and the drain region are spaced apart from each other, with the gate electrode therebetween.

MODE OF DISCLOSURE

Hereinafter, embodiments will be described in detail with reference to the accompanying drawings. In the drawings, like reference numerals denote like elements, and sizes of elements may be exaggerated for clarity and convenience of explanation. Meanwhile, embodiments described below are provided merely as an example, and various modifications may be made from the embodiments.

When an element is "on" or "above" another element, it shall be understood that not only the element may be directly on another element, but also it may be on another element in a non-contact manner.

An expression used in the singular encompasses the expression of the plural, unless it has a clearly different meaning in the context. When a portion "includes" an element, another element may be further included, rather than excluding the existence of the other element, unless otherwise described.

In addition, the terms " . . . part," etc., described in the specification refer to a unit for processing at least one function or operation, which can be implemented by a hardware, a software, or a combination thereof.

FIG. 1 is a cross-section view of a transistor according to example embodiments.

With reference to FIG. 1, a transistor 10 may be provided. The transistor 10 may include a substrate 100, a constant current formation layer 210, a pair of device isolation regions ST, a pair of source/drain regions SD, a channel layer 220, and a gate structure 300.

The substrate 100 may be a semiconductor substrate. For example, the substrate 100 may include silicon (Si). The substrate 100 may have a first conductivity type. For example, the first conductivity type may be n-type or p-type. When the conductivity type of the substrate 100 is n-type, the substrate 100 may include V group elements (e.g., P, As, etc.) as impurities. When the conductivity type of the substrate 100 is p-type, the substrate 100 may include III group elements (e.g., B, In, etc.) as impurities.

The constant current formation layer 210 may be provided on the substrate 100. For example, the constant current formation layer 210 may include silicon (Si). The constant current formation layer 210 may have the first conductivity type. When the conductivity type of the constant current formation layer 210 is n-type, the constant current formation layer 210 may include V group elements (e.g., P, As, etc.) as impurities. When the conductivity type of the constant current formation layer 210 is p-type, the constant current formation layer 210 may include III group elements (e.g., B, In, etc.) as impurities. A doping concentration of the constant current formation layer 210 may be higher than a doping concentration of the substrate 100. For example, the doping concentration of the constant current formation layer 210 may be greater than or equal to $3 \times 10^{18}$ cm$^{-3}$. An electric field may be formed between the constant current formation layer 210 and the pair of source/drain regions SD. For example, the intensity of the electric field may be greater than or equal to $10^6$ V/cm.

The pair of source/drain regions SD may be provided on the constant current formation layer 210. The pair of source/drain regions SD may be spaced apart from each other in a first direction DR1 parallel with an upper surface 100u of the substrate 100. One of the pair of source/drain regions SD may be a source of the transistor 10. The other of the pair of source/drain regions SD may be a drain of the transistor 10. The pair of source/drain regions SD may have a second conductivity type different from the first conductivity type. When the conductivity type of the pair of source/drain regions SD is p-type, the pair of source/drain regions SD may include III group elements (e.g., B, In, etc.) as impurities. When the conductivity type of the pair of source/drain regions SD is n-type, the pair of source/drain regions SD may include V group elements (e.g., P, As, etc.) as impurities. The pair of source/drain regions SD may be electrically connected to the constant current formation layer 210. For example, the pair of source/drain regions SD may be in direct contact with the constant current formation layer 210.

The channel layer 220 may be provided on the constant current formation layer 210. The channel layer 220 may be provided between the pair of source/drain regions SD. The channel layer 220 may include a material substantially identical to that of the substrate 100. For example, the channel layer 220 may include silicon (Si). The channel layer 220 may have the first conductivity type. For example, the first conductivity type may be n-type or p-type. When the conductivity type of the channel layer 220 is n-type, the channel layer 220 may include V group elements (e.g., P, As, etc.) as impurities. When the conductivity type of the channel layer 220 is p-type, the channel layer 220 may include III group elements (e.g., B, In, etc.) as impurities.

The pair of device isolation regions ST may be provided on the constant current formation layer 210. The pair of device isolation regions ST may be spaced apart from each other in the first direction DR1. The pair of device isolation regions ST may extend in a second direction DR2 perpendicular to the upper surface 100u of the substrate 100. For example, a thickness of the pair of device isolation regions ST in the second direction DR2 may be greater than a thickness of the channel layer 220 in the second direction DR2. The pair of device isolation regions ST may include an electric insulator. For example, the pair of device isolation regions ST may include $SiO_2$ or a high dielectric material (e.g., SiON, $HfO_2$, and $ZrO_2$).

The gate structure 300 may be provided on the channel layer 220. The gate structure 300 may be provided between the pair of source/drain regions SD in a viewpoint of second direction DR2. The gate structure 300 may include a gate ferroelectric film 310, a gate dielectric film 320, a gate electrode 330, and a pair of spacers 340.

The gate electrode 330 may include an electrically conductive material. For example, the gate electrode 330 may include a doped semiconductor material, a metal, an alloy, or a combination thereof. For example, the gate electrode 330 may include doped polysilicon, tungsten (W), titanium nitride (TiN), or a combination thereof.

The gate ferroelectric film 310 and the gate dielectric film 320 may electrically insulate the gate electrode 330 and the channel layer 220 from each other. The gate ferroelectric film 310 may be provided between the gate electrode 330 and the channel layer 220. For example, the gate ferroelectric film 310 may be in direct contact with an upper surface of the channel layer 220. The gate ferroelectric film 310 may include a ferroelectric material. A ferroelectric material refers to a nonconductor or a dielectric showing spontaneous polarization, and is distinguished from a multiferroic material showing two or more ferroic properties, for example, ferroelectricity, ferroelasticity, ferromagnetism, antiferromagnetism, etc. For example, the ferroelectric material may include at least one of oxide ferroelectric material, a high-molecular ferroelectric material, a fluoride ferroelectric material such as BMF ($BaMgF_4$), etc. and/or a ferroelectric material semiconductor.

The oxide ferroelectric material may include, for example, a perovskite ferroelectric such as PZT ($PbZr_xTi_{1-x}O_3$), $BaTiO_3$, $PbTiO_3$, etc., a pseudo-ilmenite ferroelectric such as $LiNbO_3$, $LiTaO_3$, etc. a tungsten-bronze (TB) ferroelectric such as $PbNb_3O_6$, $Ba_2NaNb_5O_{15}$, etc., a ferroelectric having a bismuth layer structure, such as SBT ($SrBi_2Ta_2O_9$), BLT(($Bi,La)_4Ti_3O_{12}$), $Bi_4Ti_3O_{12}$, etc., a pyrochlore ferroelectric such as $HfZrO_2$, La2Ti2O7, etc., a solid solution of the forgoing ferroelectrics, $RMnO_3$ including rare-earth elements R such as Y, Er, Ho, Tm, Yb, Lu, etc., PGO($Pb_5Ge_3O_{11}$), etc.

The high-molecular ferroelectric material may include, for example, at least one of polyvinylidenefluoride (PVDF), a polymer including PVDF, a copolymer, a terpolymer, a cyanopolymer, a polymer thereof and/or a copolymer thereof. The ferroelectric material semiconductor may include, for example, 2 to 6 groups compounds, such as CdZnTe, CdZnS, CdZnSe, CdMnS, CdFeS, CdMnSe, CdFeSe, etc.

The gate dielectric film 320 may be provided between the gate electrode 330 and the gate ferroelectric film 310. For example, the gate dielectric film 320 may be in direct contact with the gate ferroelectric film 310 and the gate electrode 330. The gate dielectric film 320 may have a material capable of implementing a desired capacitance. The gate dielectric film 320 may include a material having a high permittivity. The high permittivity may refer to a permittivity higher than that of a silicon oxide. In one embodiment, a metallic oxide including at least one metal selected from Ca, Sr, Ba, Sc, Y, La, Ti, Hf, Zr, Nb, Ta, Ce, Pr, Nd, Gd, Dy, Yb, and Lu may be used for the gate dielectric film 320. For example, the gate dielectric film 320 may include $HfO_2$, $ZrO_2$, $CeO_2$, $La_2O_3$, $Ta_2O_3$, or $TiO_2$. The gate dielectric film 320 may have a single-layer structure or a multi-layer structure.

The gate ferroelectric film 310 may have negative capacitance properties by the gate dielectric film 320.

In one embodiment, a threshold voltage of the transistor 10 may be adjusted according to a doping concentration of the substrate 100 and/or a work function of the gate electrode 330. For example, the work function of the gate electrode 330 may be adjusted by a material of the gate electrode 330 or an additional work function adjustment film (not shown). For example, the additional work function adjustment film may be arranged between the gate ferroelectric film 310 and the substrate 100.

One of the pair of source/drain regions SD, which is a drain, and the constant current formation layer 210 may form a constant current between the source/drain region SD, which is a drain, and the constant current formation layer 210. The constant current may be a band-to-band tunneling (BTBT) current between the source/drain region SD, which is a drain, and the constant current formation layer 210. The constant current may be independent of a gate voltage applied to the gate electrode 330. That is, the constant current may flow irrelevant to the gate voltage. When the transistor 10 is an n-channel metal oxide semiconductor (NMOS) transistor, the constant current may flow from the source/drain region SD, which is a drain, to the substrate 100 through the constant current formation layer 210. When the transistor 10 is a p-channel metal oxide semiconductor (PMOS) transistor, the constant current may flow from the substrate 100 to the source/drain region SD, which is a drain, through the constant current formation layer 210.

According to the present disclosure, the transistor 10 in which a constant current is formed between the constant current formation layer 210 and one of the pair of source/drain regions SD, which is a drain, may be provided.

Figure 2:
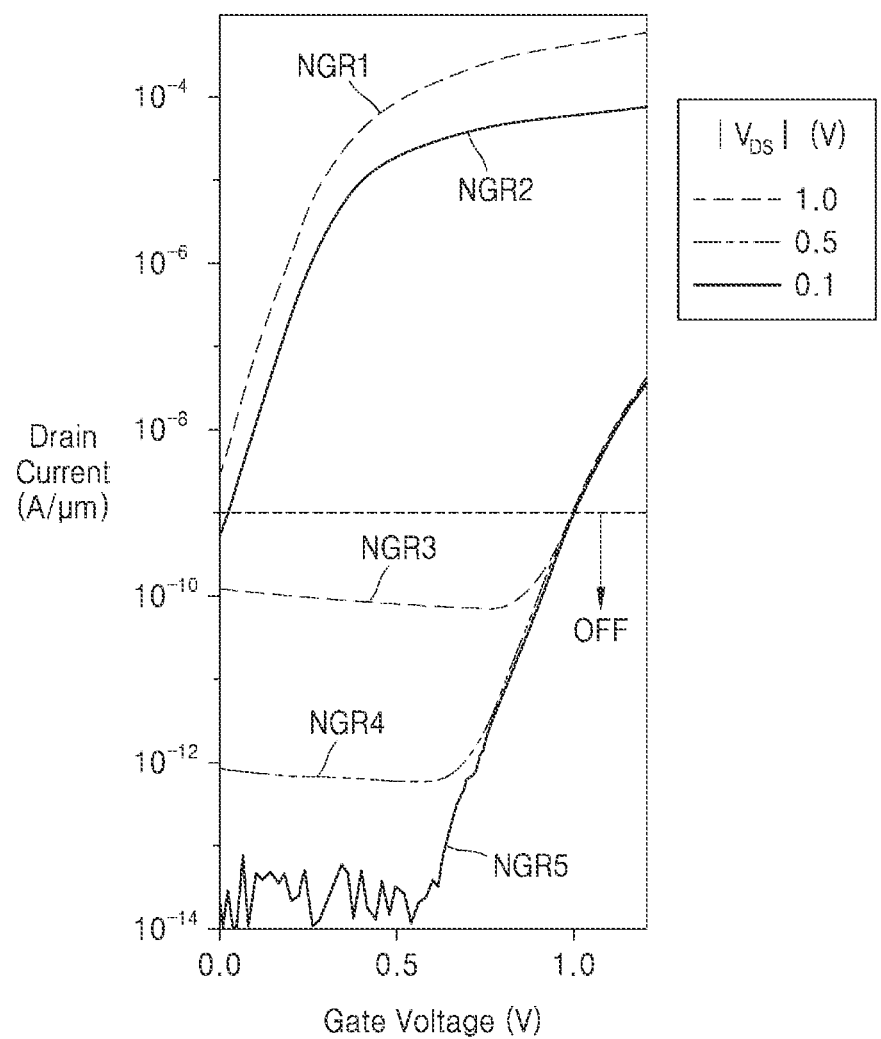
FIG. 2 shows graphs representing the relationship between a gate voltage and a drain current of n-channel metal oxide semiconductor (NMOS) transistors according to the present disclosure and conventional NMOS transistors.

FIG. 2 shows graphs representing the relationship between a gate voltage and a drain current of NMOS transistors according to the present disclosure and conventional NMOS transistors.

The gate voltage-drain current graphs of conventional NMOS transistors (NGR1 and NGR2), and the gate voltage-drain current graphs of NMOS transistors according to the present disclosure (NGR3, NGR4, and NGR5) are illustrated in FIG. 2.

The drain currents of the conventional NMOS transistors appeared not to have a constant current component flowing irrelevant to a gate voltage.

The drain currents of the NMOS transistors of the present disclosure appeared to have a constant current component flowing irrelevant to a gate voltage. For example, even when the NMOS transistors of the present disclosure are in an off-state, a constant current flows in the NMOS transistors of the present disclosure.

Figure 3:
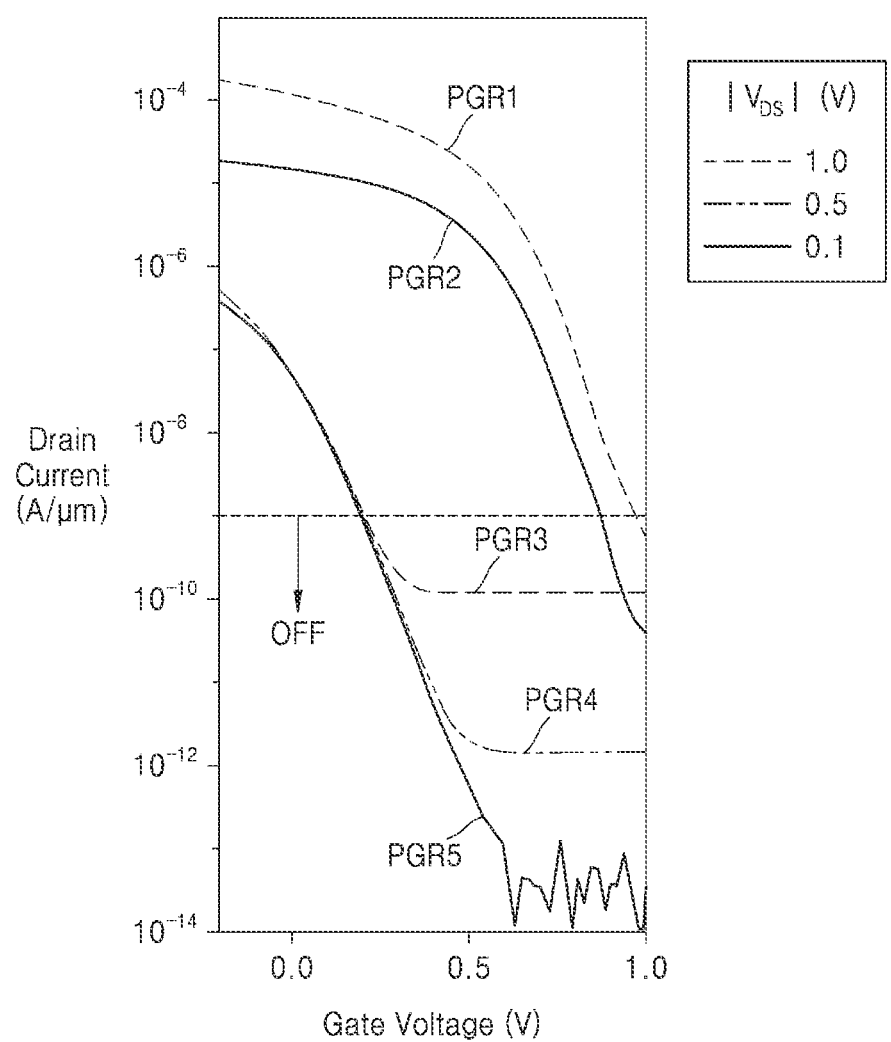
FIG. 3 shows graphs representing the relationship between a gate voltage and a drain current of p-channel metal oxide semiconductor (PMOS) transistors of the present disclosure and conventional PMOS transistors.

FIG. 3 shows graphs representing the relationship between a gate voltage and a drain current of PMOS transistors of the present disclosure and conventional PMOS transistors.

The gate voltage-drain current graphs of conventional PMOS transistors (PGR1 and PGR2), and the gate voltage-drain current graphs of PMOS transistors according to the present disclosure (PGR3, PGR4, and PGR5) are illustrated in FIG. 3.

The drain currents of the conventional PMOS transistors appeared not to have a constant current component flowing irrelevant to a gate voltage.

The drain currents of the PMOS transistors of the present disclosure appeared to have a constant current component flowing irrelevant to a gate voltage. For example, even when the PMOS transistors of the present disclosure are in an off-state, a constant current flows in the PMOS transistors of the present disclosure.

Figure 4:
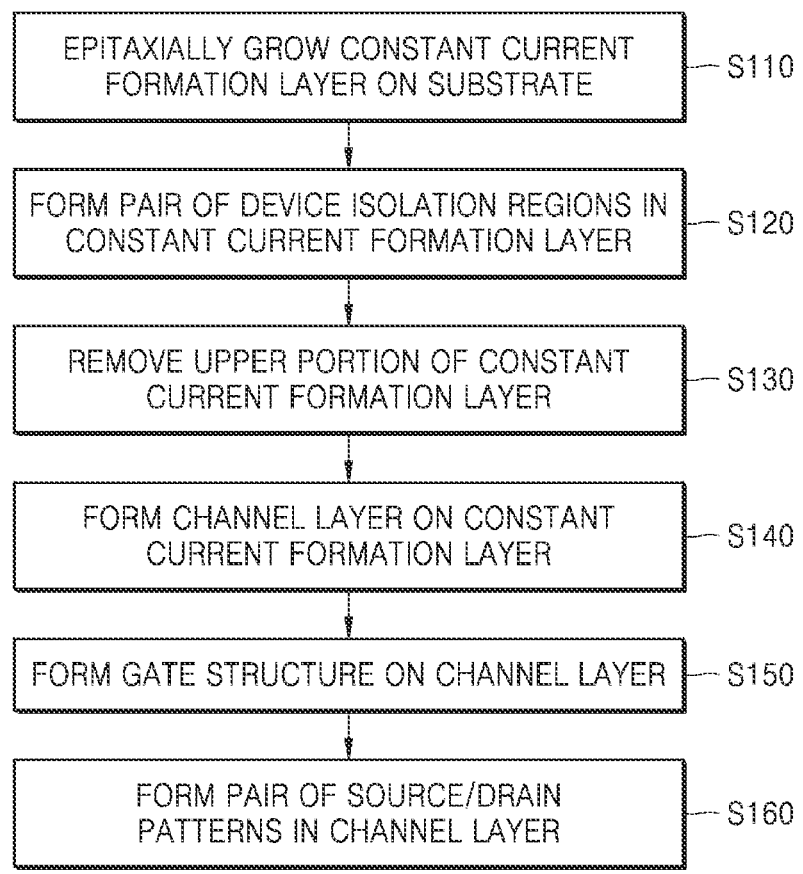
FIG. 4 is a flowchart illustrating a method of manufacturing a transistor according to an example embodiment.

FIG. 4 is a flowchart illustrating a method of manufacturing a transistor according to an example embodiment. FIGS. 5 to 9 are cross-sectional views for explaining a method of manufacturing the transistor of FIG. 1.

Figure 5:
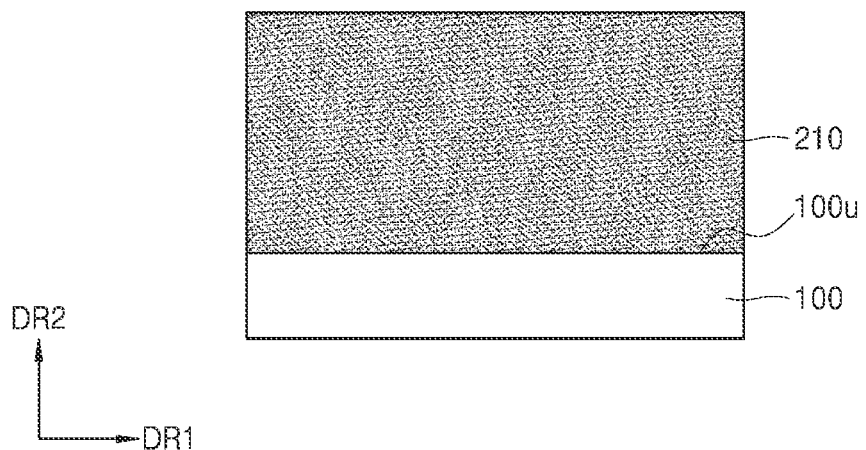
FIGS. 5 to 9 are cross-sectional views for explaining a method of manufacturing the transistor of FIG. 1.

With reference to FIGS. 4 and 5, the constant current formation layer 210 may be formed on the substrate 100 (S110). The substrate 100 may be a semiconductor substrate. For example, the substrate 100 may include silicon (Si). The substrate 100 may have the first conductivity type. For example, the first conductivity type may be n-type or p-type. When the conductivity type of the substrate 100 is n-type, the substrate 100 may include V group elements (e.g., P, As, etc.) as impurities. When the conductivity type of the substrate 100 is p-type, the substrate 100 may include III group elements (e.g., B, In, etc.) as impurities.

The constant current formation layer 210 may be formed by the epitaxial growth process. That is, the constant current formation layer 210 may be an epitaxial layer. For example, the constant current formation layer 210 may include silicon (Si). The constant current formation layer 210 may have the first conductivity type. When the conductivity type of the constant current formation layer 210 is n-type, the constant current formation layer 210 may include V group elements (e.g., P, As, etc.) as impurities. When the conductivity type of the constant current formation layer 210 is p-type, the constant current formation layer 210 may include III group elements (e.g., B, In, etc.) as impurities. A doping concentration of the constant current formation layer 210 may be higher than a doping concentration of the substrate 100. For example, the doping concentration of the constant current formation layer 210 may be greater than or equal to $3\times10^{18}$ $cm^{-3}$.

The formation of the constant current formation layer 210 may not be limited to the epitaxial growth process. In another embodiment, the formation of the constant current formation layer 210 may include providing impurities to an intrinsic semiconductor layer through an ion implantation process or a glass diffusion process. Forming the constant current formation layer 210 by the glass diffusion process may include forming an impurity film on an intrinsic semiconductor layer, and diffusing impurities included in the impurity film into the intrinsic semiconductor layer through heat treatment. For example, the impurity film may include a boron silicate glass (BSG) film or a phosphorus silicate glass (PSG) film.

Figure 6:
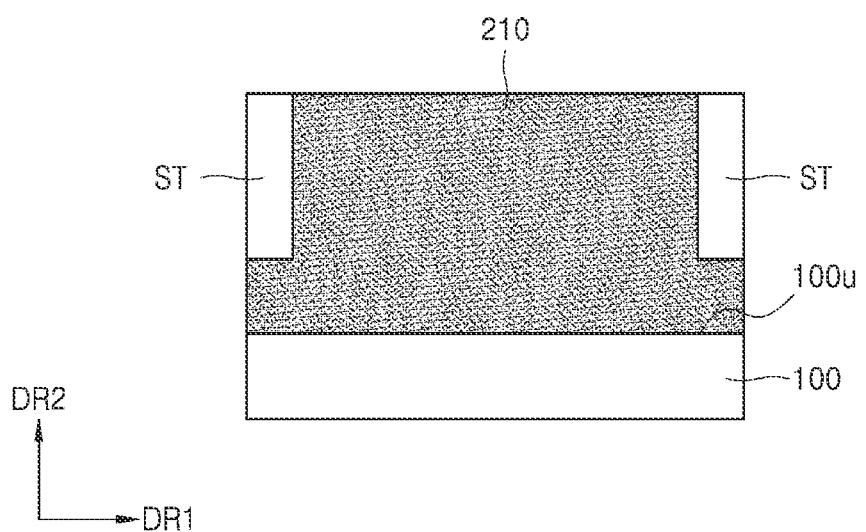

With reference to FIGS. 4 and 6, the pair of device isolation regions ST may be formed in the constant current formation layer 210 (S120). For example, the formation the pair of device isolation regions ST may include forming a recess region at the constant current formation layer 210 through an anisotropic etching process using an etching mask provided on the constant current formation layer 210 and filling the recess region with an insulator. The etching mask may be removed during or after the etching process. For example, the insulator may include $SiO_2$ or a high dielectric material (e.g., SiON, $HfO_2$, and $ZrO_2$).

Figure 7:
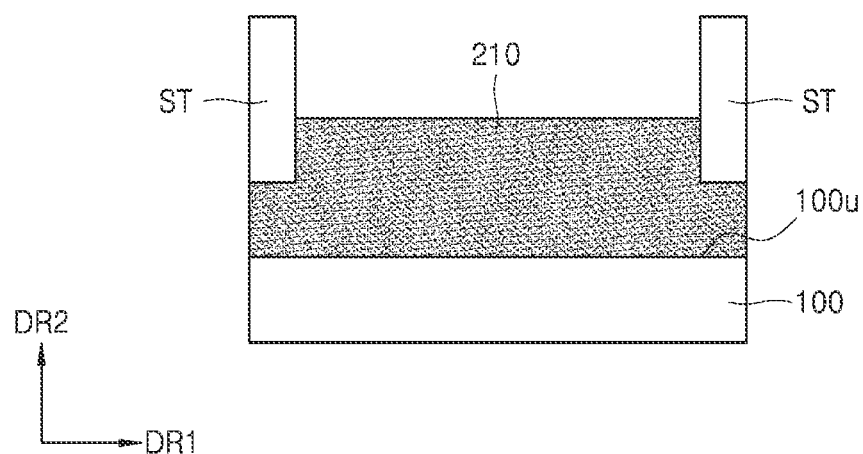

With reference to FIGS. 4 and 7, an upper portion of the constant current formation layer 210 may be removed (S130). The removing of the upper portion of the constant current formation layer 210 may include performing an etching process using an etching mask provided on the pair of device isolation regions ST. The etching mask may be removed during or after the etching process. An etching depth of the etching process may be shallower than a depth of the pair of device isolation regions ST. In other words, an upper surface of the constant current formation layer 210 left after the etching process may be arranged higher than a bottom surface of the pair of device isolation regions ST.

Figure 8:
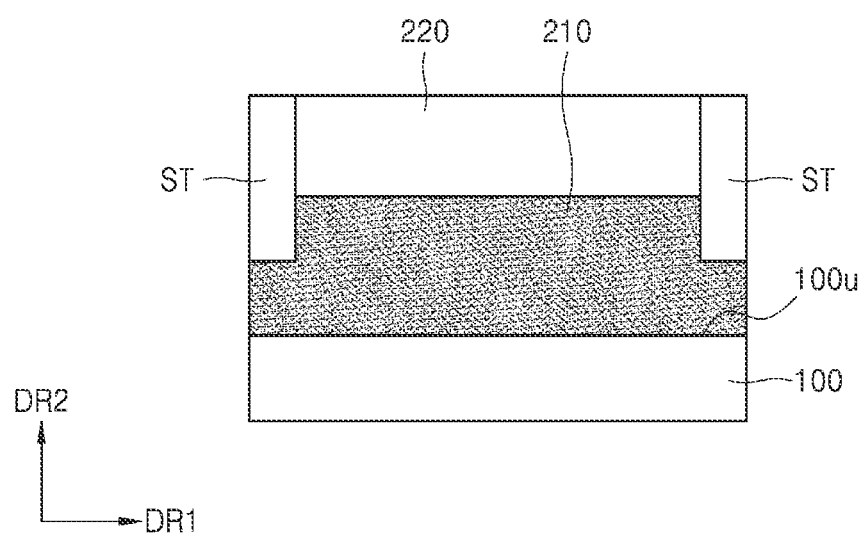

With reference to FIGS. 4 and 8, the channel layer 220 may be formed on the constant current formation layer 210 (S140). The formation of the channel layer 220 may include depositing a doped semiconductor material film (not shown) on the constant current formation layer 210 and etching the doped semiconductor material film. The process of etching the doped semiconductor material film may be performed until the pair of device isolation regions ST is exposed. For example, the channel layer 220 may include silicon (Si). The channel layer 220 may have the first conductivity type. For example, the first conductivity type may be n-type or p-type. When the conductivity type of the channel layer 220 is n-type, the channel layer 220 may include V group elements (e.g., P, As, etc.) as impurities. When the conductivity type of the channel layer 220 is p-type, the channel layer 220 may include III group elements (e.g., B, In, etc.) as impurities.

Figure 9:
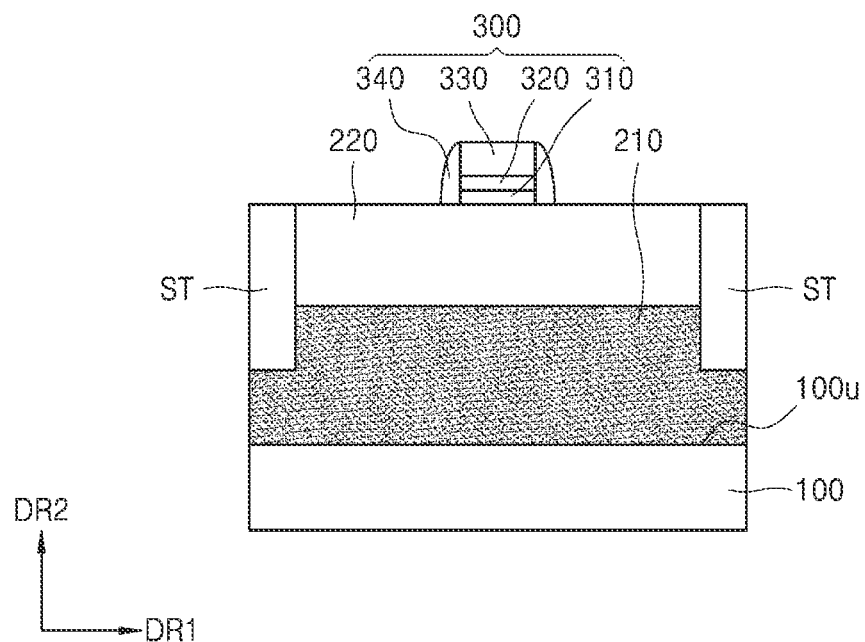

With reference to FIGS. 4 and 9, the gate structure 300 may be formed on the channel layer 220 (S150). The gate structure 300 may include the gate ferroelectric film 310, the gate dielectric film 320, and the gate electrode 330 stacked in this stated order as well as the pair of spacers 340 covering lateral sides of the gate electrode 330. The formation of the gate ferroelectric film 310, the gate dielectric film 320, and the gate electrode 330 may include sequentially depositing a ferroelectric film, a dielectric film, and an electrically conductive film on the channel layer 220 and patterning the electrically conductive film, the dielectric film, and the ferroelectric film.

The gate ferroelectric film 310 may include a ferroelectric material. A ferroelectric material refers to a nonconductor or a dielectric showing spontaneous polarization, and is distinguished from a multiferroic material showing two or more ferroic properties, for example, ferroelectricity, ferroelasticity, ferromagnetism, antiferromagnetism, etc. For example, the ferroelectric material may include at least one of oxide ferroelectric material, a high-molecular ferroelectric material, a fluoride ferroelectric material such as BMF ($BaMgF_4$), etc. and/or a ferroelectric material semiconductor.

The oxide ferroelectric material may include, for example, a perovskite ferroelectric such as PZT ($PbZr_xTi_{1-x}O_3$), $BaTiO_3$, $PbTiO_3$, etc., a pseudo-ilmenite ferroelectric such as $LiNbO_3$, $LiTaO_3$, etc. a tungsten-bronze (TB) ferroelectric such as $PbNb_3O_6$, $Ba_2NaNb_5O_{15}$, etc., a ferroelectric having a bismuth layer structure, such as SBT ($SrBi_2Ta_2O_9$), BLT(($Bi,La)_4Ti_3O_{12}$), $Bi_4Ti_3O_{12}$, etc., a pyrochlore ferroelectric such as $HfZrO_2$, $La_2Ti_2O_7$, etc., a solid solution of the forgoing ferroelectrics, $RMnO_3$ including rare-earth elements R such as Y, Er, Ho, Tm, Yb, Lu, etc., PGO($Pb_5Ge_3O_{11}$), etc.

The high-molecular ferroelectric material may include, for example, at least one of polyvinylidenefluoride (PVDF), a polymer including PVDF, a copolymer, a terpolymer, a cyanopolymer, a polymer thereof and/or a copolymer thereof. The ferroelectric material semiconductor may include, for example, 2 to 6 groups compounds, such as CdZnTe, CdZnS, CdZnSe, CdMnS, CdFeS, CdMnSe, CdFeSe, etc.

The gate dielectric film 320 may be provided between the gate electrode 330 and the gate ferroelectric film 310. For example, the gate dielectric film 320 may be in direct contact with the gate ferroelectric film 310 and the gate electrode 330. The gate dielectric film 320 may have a material capable of implementing a desired capacitance. The gate dielectric film 320 may include a material having a high permittivity. The high permittivity may refer to a permittivity higher than that of a silicon oxide. In one embodiment, a metallic oxide including at least one metal selected from Ca, Sr, Ba, Sc, Y, La, Ti, Hf, Zr, Nb, Ta, Ce, Pr, Nd, Gd, Dy, Yb, and Lu may be used for the gate dielectric film 320. For example, the gate dielectric film 320 may include $HfO_2$, $ZrO_2$, $CeO_2$, $La_2O_3$, $Ta_2O_3$, or $TiO_2$. The gate dielectric film 320 may have a single-layer structure or a multi-layer structure.

The gate ferroelectric film 310 may have negative capacitance properties by the gate dielectric film 320.

The gate electrode 330 may include an electrically conductive material. For example, the gate electrode 330 may include a doped semiconductor material, a metal, an alloy, or a combination thereof. For example, the gate electrode 330 may include doped polysilicon, tungsten (W), titanium nitride (TiN), or a combination thereof.

The formation of the pair of spacers 340 may include forming an insulating film extending along surfaces of the pair of device isolation regions ST, the channel layer 220, the gate ferroelectric film 310, the gate dielectric film 320, and the gate electrode 330, and leaving the insulating film on lateral sides of the gate ferroelectric film 310, the gate dielectric film 320, and the gate electrode 330 by performing a large-scale anisotropic etching process.

With reference to FIGS. 4 and 1, the pair of source/drain regions SD may be formed in the channel layer 220 (S160). The pair of source/drain regions SD may be spaced apart from each other with the gate structure 300 therebetween. The pair of source/drain regions SD may have a conductivity type different than a conductivity type of the constant current formation layer 210. When the conductivity type of the pair of source/drain regions SD is n-type, the pair of source/drain regions SD may include V group elements (e.g., P, As, etc.) as impurities. When the conductivity type of the pair of source/drain regions SD is p-type, the pair of source/drain regions SD may include III group elements (e.g., B, In, etc.) as impurities. In one embodiment, the pair of source/drain regions SD may be formed by the ion implantation process.

According to the present disclosure, a method of manufacturing the transistor 10 in which a constant current flows between the constant current formation layer 210 and one of the pair of source/drain regions SD, which is a drain, may be provided.

Figure 10:
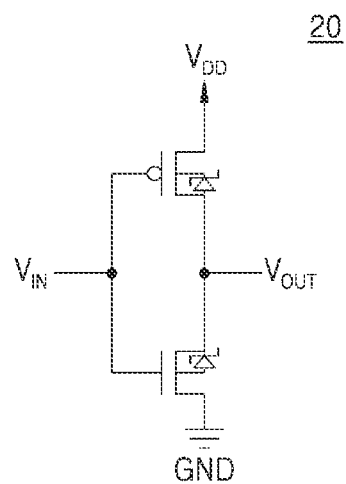
FIG. 10 is a circuit diagram of a ternary inverter according to example embodiments.

FIG. 10 is a circuit diagram of a ternary inverter according to example embodiments. For the sake of concise explanation, any description substantially identical to explanations made with reference to FIG. 1 may be omitted.

With reference to FIG. 10, a ternary inverter 20 including an NMOS transistor and a PMOS transistor may be provided. Each of the NMOS transistor and the PMOS transistor may be substantially identical to the transistor 10 described with reference to FIG. 1. A conductivity type of the substrate 100 and the constant current formation layer 210 of the NMOS transistor may be p-type. A conductivity type of the pair of source/drain regions SD of the NMOS transistor may be n-type. A conductivity type of the substrate 100 and the constant current formation layer 210 of the PMOS transistor may be n-type. A conductivity type of the pair of source/drain regions SD of the PMOS transistor may be p-type.

A ground voltage may be applied to a source and a substrate of the NMOS transistor. For the sake of concise explanation, the ground voltage is assumed to be 0 volt (V) hereinafter. A driving voltage $V_{DD}$ may be applied to a source and a substrate of the PMOS transistor. An input voltage Vin may be applied to each of a gate electrode of the NMOS transistor and a gate electrode of the PMOS transistor.

A drain of the NMOS transistor and a drain of the PMOS transistor may be electrically connected to each other and thus may have the same voltage. The voltage of the drain of the NMOS transistor and the drain of the PMOS transistor may be an output voltage Vout of the ternary inverter 20.

A constant current may flow from the drain of the NMOS transistor to the substrate. A constant current may flow from the substrate of the PMOS transistor to the drain. The constant currents may be independent of the input voltage Vin.

In one embodiment, a first input voltage may be applied to the gate electrode of the PMOS transistor and the gate electrode of the NMOS transistor so that the PMOS transistor has a constant current predominant over a channel current, and the NMOS transistor has a channel current predominant over a constant current. At this time, the output voltage Vout of the ternary inverter 20 may be a first voltage.

In another embodiment, a second input voltage may be applied to the gate electrode of the PMOS transistor and the gate electrode of the NMOS transistor so that the NMOS transistor has a constant current predominant over a channel current, and the PMOS transistor has a channel current predominant over a constant current. At this time, the output voltage Vout of the ternary inverter 20 may be a second voltage greater than the first voltage.

In another embodiment, a third input voltage may be applied to the gate electrode of the PMOS transistor and the gate electrode of the NMOS transistor so that each of the NMOS transistor and the PMOS transistor has a constant current predominant over a channel current. At this time, the output voltage Vout of the ternary inverter 20 may be a third voltage between the first voltage and the second voltage.

A constant current flowing from the drain of the NMOS transistor to the substrate and a constant current flowing from the substrate of the PMOS transistor to the drain may flow irrelevant to the gate voltages applied to the gate electrodes of the PMOS transistor and the NMOS transistor. A current in the ternary inverter 20 may flow from the substrate of the PMOS transistor to the substrate of the NMOS transistor through the drain of the PMOS transistor and the drain of the NMOS transistor. The driving voltage $V_{DD}$ applied to the substrate of the PMOS transistor may be distributed to the resistance between the substrate and the drain of the PMOS transistor and the resistance between the substrate and the drain of the NMOS transistor. The output voltage Vout may be a voltage applied to the resistance between the substrate of the NMOS transistor and the drain of the NMOS transistor. The output voltage Vout may have a value between the driving voltage $V_{DD}$ and 0 V.

The output voltage Vout may be 0 V ("0" state), a voltage between the driving voltage $V_{DD}$ and 0 V ("1" state), or the driving voltage $V_{DD}$ ("2" state) according to the input voltage Vin. According to the present disclosure, the ternary inverter 20 having three different states according to the input voltage Vin may be provided.

Figure 11:
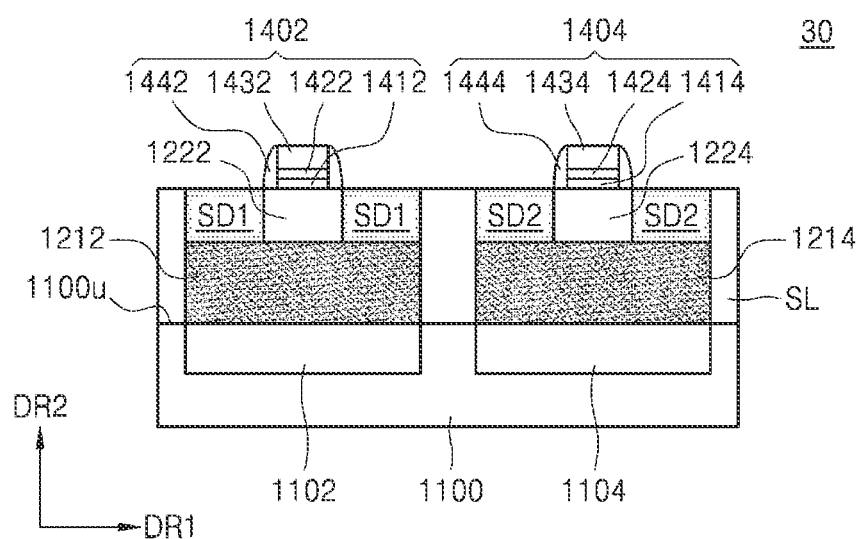
FIG. 11 is a cross-sectional view of a ternary inverter according to an example embodiment.

FIG. 11 is a cross-sectional view of a ternary inverter according to an example embodiment. For the sake of concise explanation, any description substantially identical to explanations made with reference to FIG. 1 may be omitted.

With reference to FIG. 11, may include a substrate 1100, a first well region 1102, a second well region 1104, a device isolation film SL, a first constant current formation layer 1212, a second constant current formation layer 1214, a first channel layer 1222, a second channel layer 1224, a first pair of source/drain regions SD1, a second pair of source/drain region SD2, a first gate structure 1402, and a second gate structure 1404.

The substrate 1100 may be a semiconductor substrate. For example, the substrate 1100 may include silicon (Si). The substrate 1100 may be an intrinsic semiconductor substrate or a semiconductor substrate having a conductivity type.

The first well region 1102 and the second well region 1104 may be provided on the substrate 1100. The first well region 1102 and the second well region 1104 may be spaced apart from each other in the first direction DR1 parallel with an upper surface 1100u of the substrate 1100. The first well region 1102 may be a p-type region. For example, the first well region 1102 may include III group elements (for example, B, In, etc.) as impurities. The second well region 1104 may be an n-type region. For example, the second well region 1104 may include V group elements (for example, P, As, etc.) as impurities.

The device isolation film SL exposing the first well region 1102 and the second well region 1104 may be provided on the substrate 1100. The device isolation film SL may include substantially the same material as the pair of device isolation films SL described with reference to FIG. 1.

The first constant current formation layer 1212 may be provided on the first well region 1102. The first constant current formation layer 1212 may be an epitaxial layer. For example, the first constant current formation layer 1212 may include silicon (Si). A conductivity type of the first constant current formation layer 1212 may be p-type. For example, the first constant current formation layer 1212 may include III group elements (for example, B, In, etc.) as impurities. A doping concentration of the first constant current formation layer 1212 may be higher than a doping concentration of the substrate 1100. For example, the doping concentration of the first constant current formation layer 1212 may be greater than or equal to $3\times10^{18}$ cm$^{-3}$.

The second constant current formation layer 1214 may be provided on the second well region 1104. The second constant current formation layer 1214 may be an epitaxial layer. The second constant current formation layer 1214 may be selectively grown on the second well region 1104 exposed by a second pair of device isolation regions ST. For example, the second constant current formation layer 1214 may include silicon (Si). A conductivity type of the second constant current formation layer 1214 may be n-type. For example, the second constant current formation layer 1214 may include V group elements (for example, P, As, etc.) as impurities. A doping concentration of the second constant current formation layer 1214 may be higher than a doping concentration of the substrate 1100. For example, the doping concentration of the second constant current formation layer 1214 may be greater than or equal to $3\times10^{18}$ cm$^{-3}$.

The first channel layer 1222 may be provided on the first constant current formation layer 1212. The first channel layer 1222 may be an epitaxial layer. For example, the first channel layer 1222 may include silicon (Si). A conductivity type of the first channel layer 1222 may be p-type. For example, the first channel layer 1222 may include III group elements (for example, B, In, etc.) as impurities. A doping concentration of the first channel layer 1222 may be lower than a doping concentration of the first constant current formation layer 1212. For example, the doping concentration of the first channel layer 1222 may be substantially identical to a doping concentration of the substrate 1100.

The second channel layer 1224 may be provided on the second constant current formation layer 1214. The second channel layer 1224 may be an epitaxial layer. For example, the second channel layer 1224 may include silicon (Si). A conductivity type of the second channel layer 1224 may be n-type. For example, the second channel layer 1224 may include V group elements (for example, P, As, etc.) as impurities. A doping concentration of the second channel layer 1224 may be lower than a doping concentration of the second constant current formation layer 1214. For example, the doping concentration of the second channel layer 1224 may be substantially identical to a doping concentration of the substrate 1100.

A first pair of source/drain regions SD may be provided on the first constant current formation layer 1212. The first pair of source/drain regions SD may be spaced apart from each other in the first direction DR1 with the first channel layer 1222 therebetween. A conductivity type of the first pair of source/drain regions SD may be n-type. For example, the first pair of source/drain regions SD may include V group elements (for example, P, As, etc.) as impurities.

The second pair of source/drain regions SD may be provided on the second constant current formation layer 1214. The second pair of source/drain regions SD may be spaced apart from each other in the first direction DR1 with the second channel layer 1224 therebetween. A conductivity type of the second pair of source/drain regions SD may be p-type. For example, the second pair of source/drain regions SD may include III group elements (for example, B, In, etc.) as impurities.

The first gate structure 1402 may be provided on the first channel layer 1222. The first gate structure 300 may include a first gate ferroelectric film 1412, a first gate dielectric film 1422, a first gate electrode 1432, and a first pair of spacers 1442. The first gate ferroelectric film 1412, the first gate dielectric film 1422, the first gate electrode 1432, and the first pair of spacers 1442 may be substantially identical to the gate ferroelectric film 310, the gate dielectric film 320, the gate electrode 330, and the pair of spacers 340 described with reference to FIG. 1, respectively.

The second gate structure 1404 may be provided on the second channel layer 1224. The second gate structure 1400 may include a second gate ferroelectric film 1414, a second gate dielectric film 1424, a second gate electrode 1434, and a second pair of spacers 1444. The second gate ferroelectric film 1414, the second gate dielectric film 1424, the second gate electrode 1434, and the second pair of spacers 1444 may be substantially identical to the gate ferroelectric film 310, the gate dielectric film 320, the gate electrode 330, and the pair of spacers 340 described with reference to FIG. 1, respectively.

According to the present disclosure, the ternary inverter 30 may be provided. The first well region 1102, the first constant current formation layer 1212, the first channel layer 1222, the first pair of source/drain regions SD1, and the first gate structure 1402 may constitute the NMOS transistor. The second well region 1104, the second constant current formation layer 1214, the second channel layer 1224, the second pair of source/drain region SD2, and the second gate structure 1404 may constitute the PMOS transistor. The ground voltage may be applied to the first well region 1102 and the source of the NMOS transistor. The driving voltage may be applied to the second well region 1104 and the source of the PMOS transistor. The input voltage Vin may be applied to each of the first gate electrode 1432 of the NMOS transistor and the second gate electrode 1434 of the PMOS transistor.

The drain of the NMOS transistor and the drain of the PMOS transistor may be electrically connected to each other. The voltage of the drain of the NMOS transistor and the drain of the PMOS transistor may be the output voltage Vout of the ternary inverter 30. The descriptions on the ternary inverter 30 may be substantially identical to the descriptions made with reference to FIG. 10.

Figure 12:
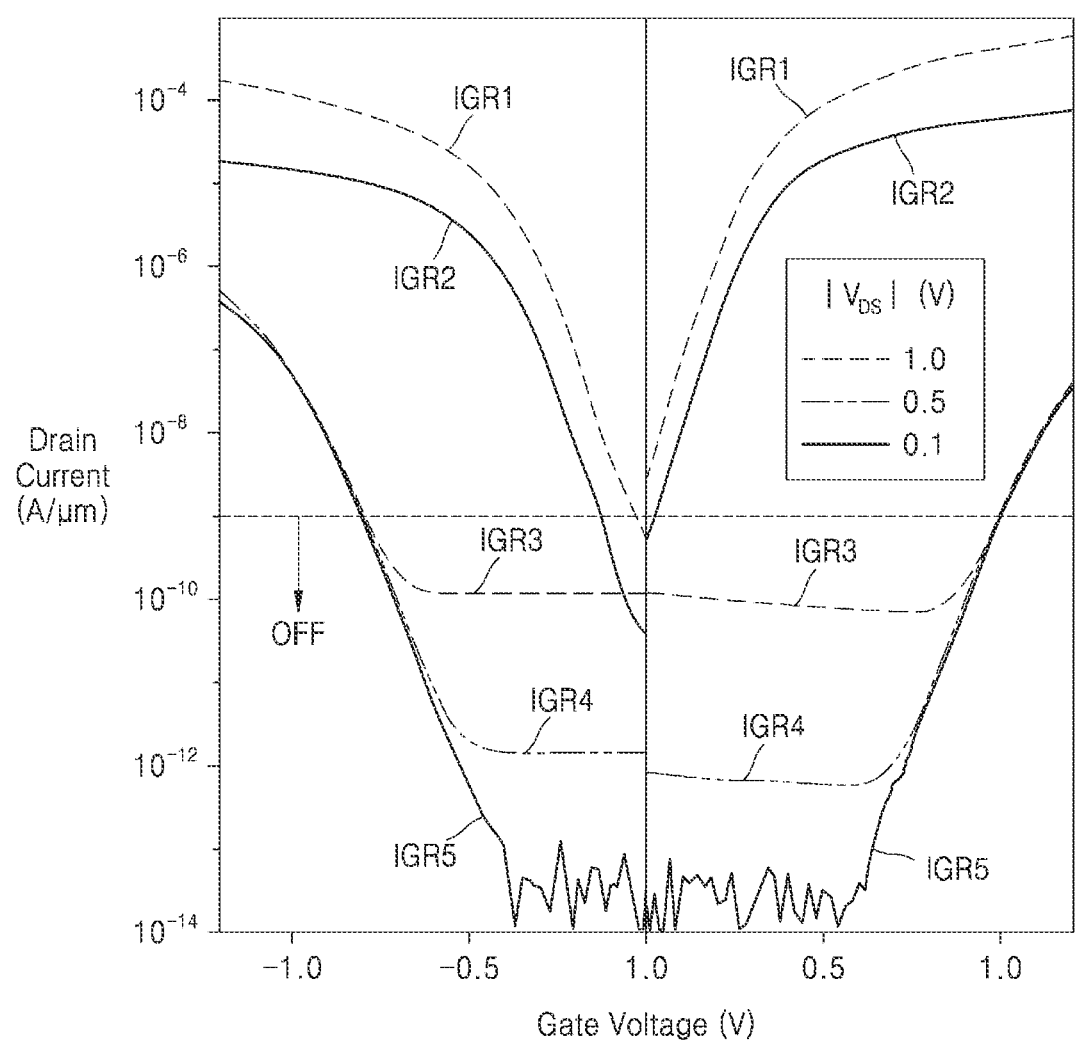
FIG. 12 shows graphs representing the relationship between a gate voltage and a drain current of binary inverters and ternary inverters of the present disclosure.

FIG. 12 shows graphs representing the relationship between a gate voltage and a drain current of binary inverters and ternary inverters of the present disclosure.

The gate voltage-drain current graphs of binary inverters (IGR1 and IGR2), and the gate voltage-drain current graphs of ternary inverters according to the present disclosure (IGR3, IGR4, and IGR5) are illustrated in FIG. 12.

The drain currents of the binary inverters appeared not to have a constant current component flowing irrelevant to a gate voltage.

The drain currents of the ternary inverters of the present disclosure appeared to have a constant current component flowing irrelevant to a gate voltage. For example, even when the ternary inverters of the present disclosure are in an off-state, a constant current flows in the ternary inverters of the present disclosure.

Figure 13:
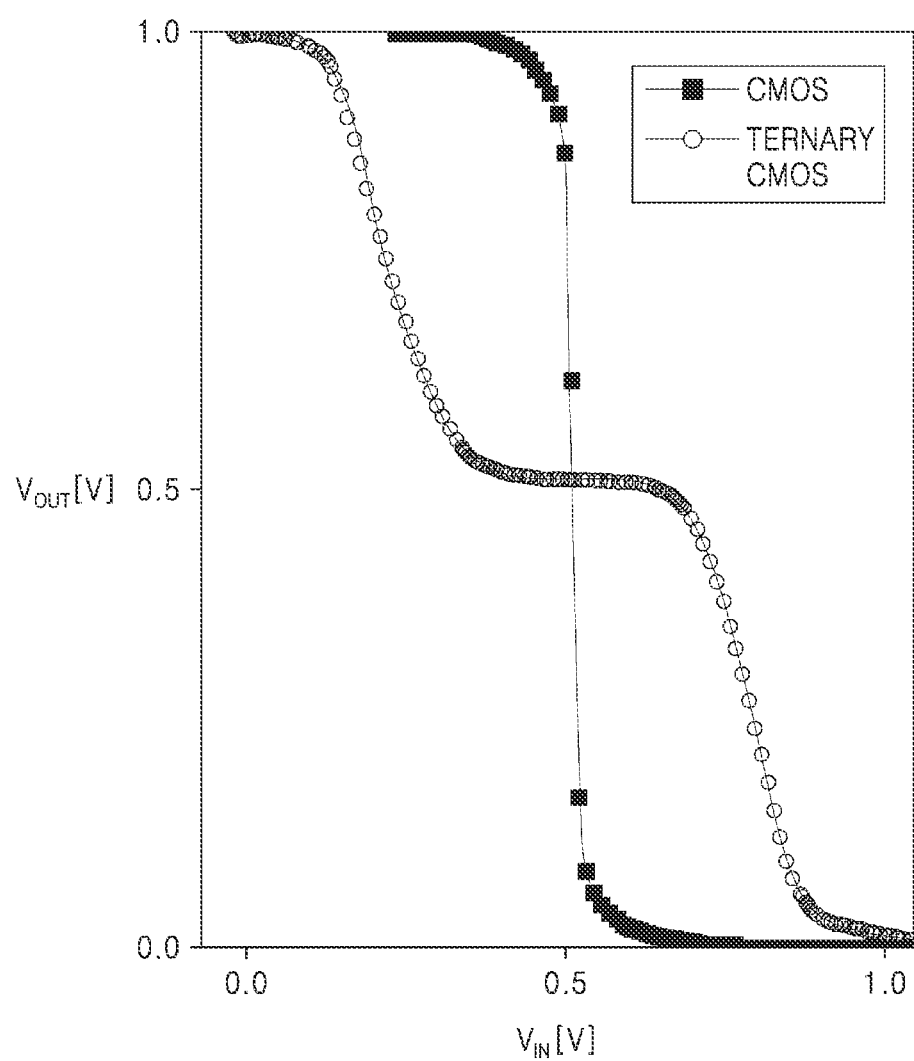
FIG. 13 shows graphs representing the relationship between an input voltage Vin and an output voltage Vout of binary inverters and ternary inverters of the present disclosure.

FIG. 13 shows graphs representing the relationship between an input voltage Vin and an output voltage Vout of binary inverters and ternary inverters of the present disclosure.

With reference to FIG. 13, the driving voltage $V_{DD}$ of the binary inverter and the ternary inverter of the present disclosure is 1.0 V, and a ground voltage GND thereof is 0 V. The input voltage Vin of the ternary inverter and the binary inverter is 0 V to 1.0 V.

In the case of binary inverter, when the input voltage changes from 0 V to 1 V, the output voltage Vout is drastically decreased from 1 V to 0 V around the input voltage of 0.5 V. That is, the binary inverter has two different states (e.g., "0" state and "1" state).

In the case of ternary inverter, when the input voltage changes from 0 V to 1 V, the output voltage Vout is drastically decreased from 1 V to 0.5 V, then remains at 0.5 V, and finally, once again drastically reduced from 0.5 V to 0 V. That is, the ternary inverter of the present disclosure has three different states (e.g., "0" state, "1" state, and "2" state).

Figure 14:
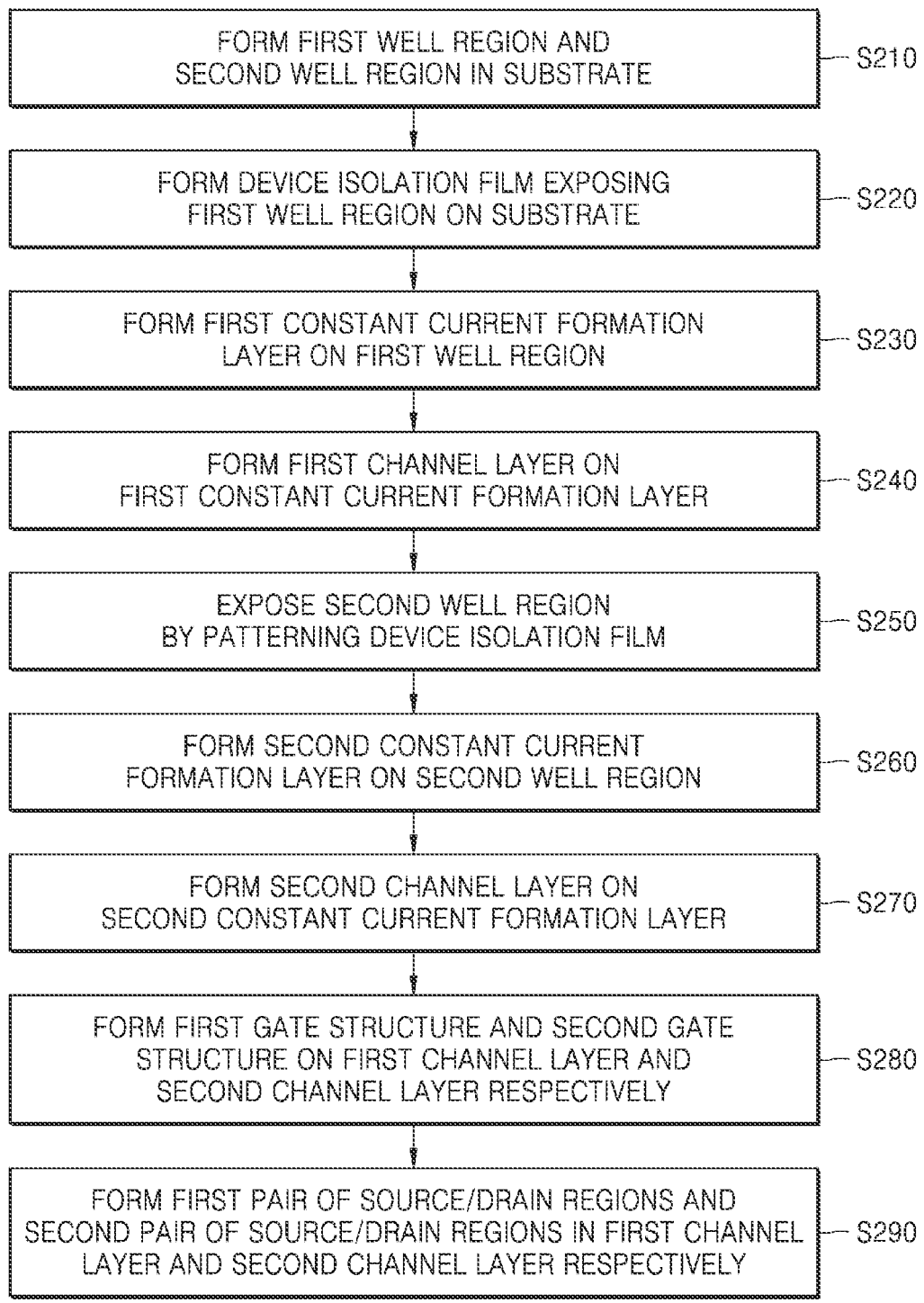
FIG. 14 is a flowchart illustrating a method of manufacturing a ternary inverter according to an example embodiment.

FIG. 14 is a flowchart illustrating a method of manufacturing a ternary inverter according to an example embodiment. FIGS. 15 to 22 are cross-sectional views for explaining a method of manufacturing the ternary inverter of FIG. 14. For the sake of concise explanation, any description substantially identical to explanations made with reference to FIG. 11 may be omitted.

Figure 15:
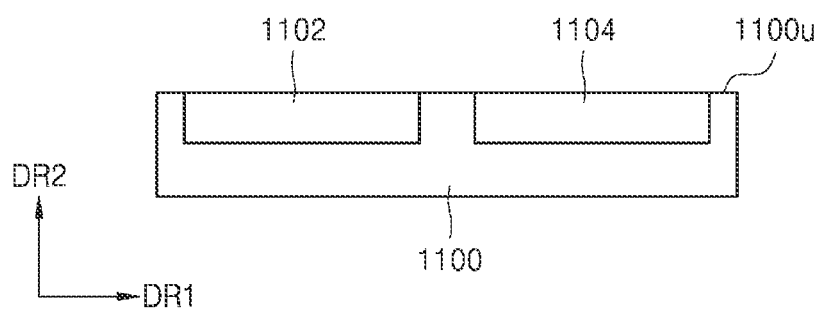
FIGS. 15 to 22 are cross-sectional views for explaining a method of manufacturing the ternary inverter of FIG. 14.

With reference to FIGS. 14 and 15, the first well region 1102 and the second well region 1104 may be formed in the substrate 1100 (S210). The substrate 1100 may be a semiconductor substrate. For example, the substrate 1100 may include silicon (Si). The substrate 1100 may be an intrinsic semiconductor substrate or a semiconductor substrate having a conductivity type.

The first well region 1102 and the second well region 1104 may be formed at an upper portion of the substrate 1100. The first well region 1102 and the second well region 1104 may be spaced apart from each other in the first direction DR1 parallel with the upper surface 1100u of the substrate 1100. The first well region 1102 may be a p-type region. For example, the first well region 1102 may include III group elements (for example, B, In, etc.) as impurities. The formation of the first well region 1102 may include providing a mask exposing a region in which the first well region 1102 is formed on the substrate 1100 and injecting impurities (e.g., III group elements) into the region in which the first well region 1102 is formed. For example, the injection of the impurities may be performed by the ion implantation process. The mask may be removed after the process of injecting the impurities.

The second well region 1104 may be an n-type region. For example, the second well region 1104 may include V group elements (for example, P, As, etc.) as impurities. The formation of the second well region 1104 may include providing a mask exposing a region in which the second well region 1104 is formed on the substrate 1100 and injecting impurities (e.g., V group elements) into the region in which the second well region 1104 is formed. For example, the injection of the impurities into the region in which the second well region 1104 is formed may be performed by the ion implantation process. The mask may be removed after the process of injecting the impurities.

Figure 16:
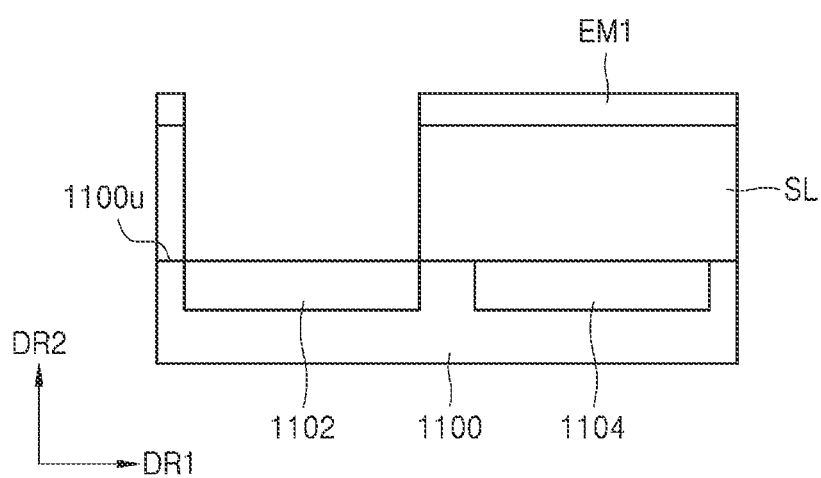

With reference to FIGS. 14 and 16, the device isolation film SL exposing the first well region 1102 may be provided on the substrate 1100 (S220). For example, the device isolation film SL may be formed by a process of depositing an insulator on the substrate 1100. For example, the device isolation film SL may include $SiO_2$. The device isolation film SL may be patterned to expose the first well region 1102. The patterning of the device isolation film SL may include an anisotropic etching process using a first etching mask EM1 provided on the device isolation film SL. For example, the first etching mask EM1 may include a photoresist material.

Figure 17:
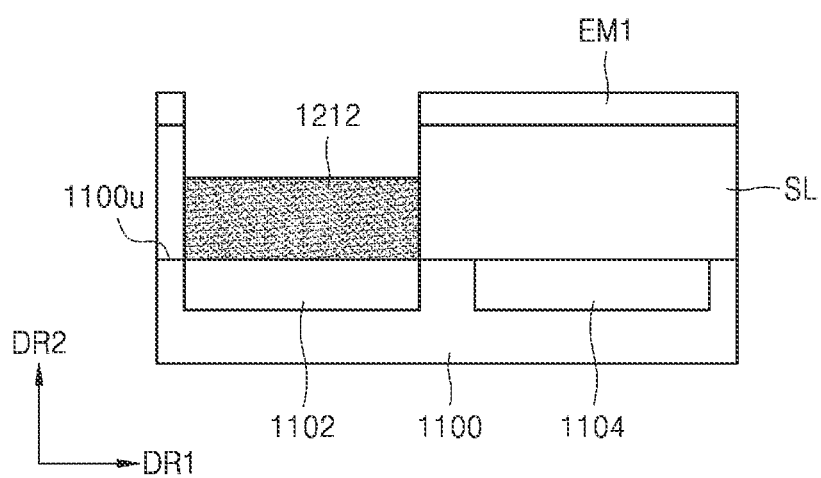

With reference to FIGS. 14 and 17, the first constant current formation layer 1212 may be formed on the first well region 1102 (S230). The first constant current formation layer 1212 may be formed by an epitaxial growth process. That is, the first constant current formation layer 1212 may be an epitaxial layer. For example, the first constant current formation layer 1212 may include silicon (Si). A conductivity type of the first constant current formation layer 1212 may be p-type. For example, the first constant current formation layer 1212 may include III group elements (for example, B, In, etc.) as impurities. A doping concentration of the first constant current formation layer 1212 may be higher than a doping concentration of the substrate 1100. For example, the doping concentration of the first constant current formation layer 1212 may be greater than or equal to $3\times10^{18}$ $cm^{-3}$. The first constant current formation layer 1212 may be selectively grown on the first well region 1102 exposed by the device isolation film. The first constant current formation layer 1212 may be formed up to a position lower than an upper surface of the device isolation film SL. A height of an upper surface of the first constant current formation layer 1212 may be lower than the upper surface of the device isolation film SL. The height may be a distance from the upper surface 1100u of the substrate 1100.

The formation of the first constant current formation layer 1212 may not be limited to the epitaxial growth process. In another embodiment, the formation of the first constant current formation layer 1212 may include providing impurities to an intrinsic semiconductor layer through the ion implantation process or the glass diffusion process. Forming the first constant current formation layer 1212 by the glass diffusion process may include forming an impurity film on an intrinsic semiconductor layer, and diffusing impurities included in the impurity film into the intrinsic semiconductor layer through heat treatment. For example, the impurity film may include a boron silicate glass (BSG) film or a phosphorus silicate glass (PSG) film.

Figure 18:
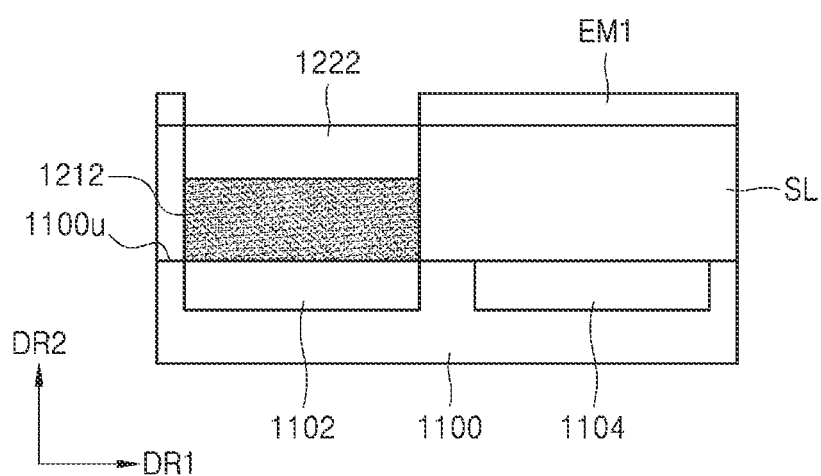

With reference to FIGS. 14 and 18, the first channel layer 1222 may be formed on the first constant current formation layer 1212 (S240). The first channel layer 1222 may be formed by the epitaxial growth process. That is, the first channel layer 1222 may be an epitaxial layer. For example, the first channel layer 1222 may include silicon (Si). A conductivity type of the first channel layer 1222 may be p-type. For example, the first channel layer 1222 may include III group elements (for example, B, In, etc.) as impurities. A doping concentration of the first channel layer 1222 may be lower than a doping concentration of the first constant current formation layer 1212. For example, the doping concentration of the first channel layer 1222 may be substantially identical to a doping concentration of the substrate 1100. The first channel layer 1222 may be selectively grown on the first constant current formation layer 1212 by the device isolation film SL. The first etching mask EM1 may be removed after the first channel layer 1222 is formed.

Figure 19:
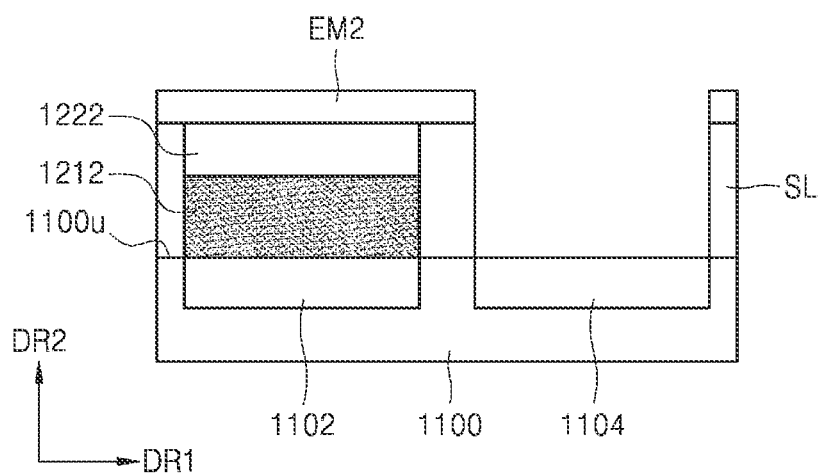

With reference to FIGS. 14 and 19, the device isolation film SL may be patterned to expose the second well region 1104 (S250). The patterning of the device isolation film SL may include an anisotropic etching process using a second etching mask EM2 provided on the device isolation film SL.

Figure 20:
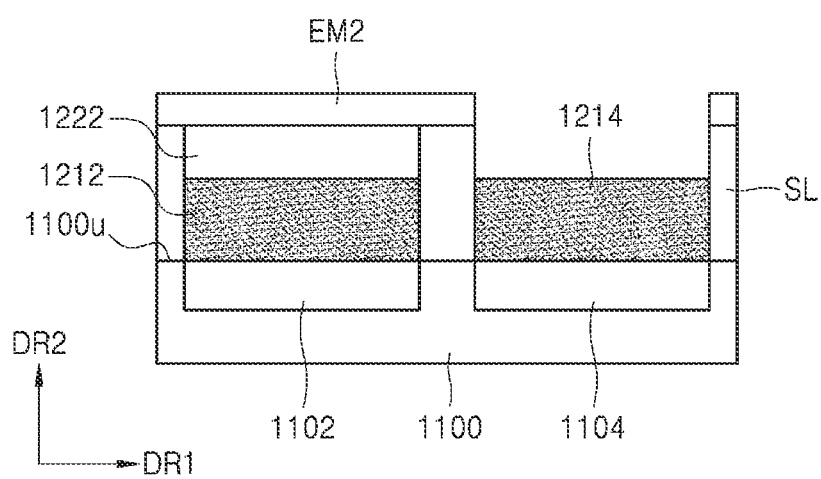

With reference to FIGS. 14 and 20, the second constant current formation layer 1214 may be formed on the second well region 1104 (S260). The second constant current formation layer 1214 may be formed by the epitaxial growth process. That is, the second constant current formation layer 1214 may be an epitaxial layer. The second constant current formation layer 1214 may be selectively grown on the second well region 1104 exposed by the device isolation film SL. For example, the second constant current formation layer 1214 may include silicon (Si). A conductivity type of the second constant current formation layer 1214 may be n-type. For example, the second constant current formation layer 1214 may include V group elements (for example, P, As, etc.) as impurities. A doping concentration of the second constant current formation layer 1214 may be higher than a doping concentration of the substrate 1100. For example, the doping concentration of the second constant current formation layer 1214 may be greater than or equal to $3\times10^{18}$ $cm^{-3}$. The second constant current formation layer 1214 may be selectively grown on the second well region 1104 exposed by the device isolation film SL. The second constant current formation layer 1214 may be formed up to a position lower than an upper surface of the device isolation film SL. A height of an upper surface of the second constant current formation layer 1214 may be lower than the upper surface of the device isolation film SL. The height may be a distance from the upper surface 1100u of the substrate 1100. For example, the height of the upper surface of the second constant current formation layer 1214 may be substantially identical to the height of the upper surface of the first constant current formation layer 1212.

The formation of the second constant current formation layer 1214 may not be limited to the epitaxial growth process. In another embodiment, formation of the second constant current formation layer 1214 may include providing impurities to an intrinsic semiconductor layer through the ion implantation process or the glass diffusion process. Forming the second constant current formation layer 1214 by the glass diffusion process may include forming an impurity film on an intrinsic semiconductor layer, and diffusing impurities included in the impurity film into the intrinsic semiconductor layer through heat treatment. For example, the impurity film may include a boron silicate glass (BSG) film or a phosphorus silicate glass (PSG) film.

Figure 21:
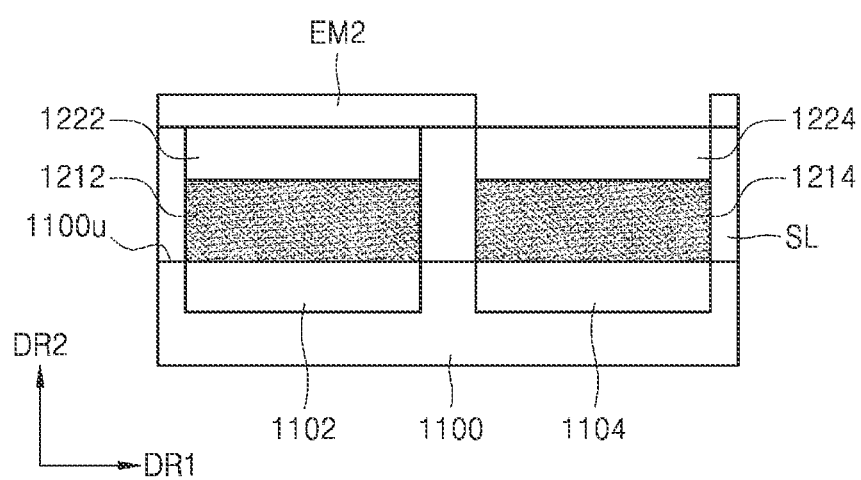

With reference to FIGS. 14 and 21, the second channel layer 1224 may be formed on the second constant current formation layer 1214 (S270). The second channel layer 1224 may be formed by the epitaxial growth process. That is, the second channel layer 1224 may be an epitaxial layer. For example, the second channel layer 1224 may include silicon (Si). A conductivity type of the second channel layer 1224 may be n-type. For example, the second channel layer 1224 may include V group elements (for example, P, As, etc.) as impurities. A doping concentration of the second channel layer 1224 may be lower than a doping concentration of the second constant current formation layer 1214. For example, the doping concentration of the second channel layer 1224 may be substantially identical to a doping concentration of the substrate 1100. The second channel layer 1224 may be selectively grown on the second constant current formation layer 1214 by the device isolation film SL. The second etching mask EM2 may be removed after the second channel layer 1224 is formed.

Figure 22:
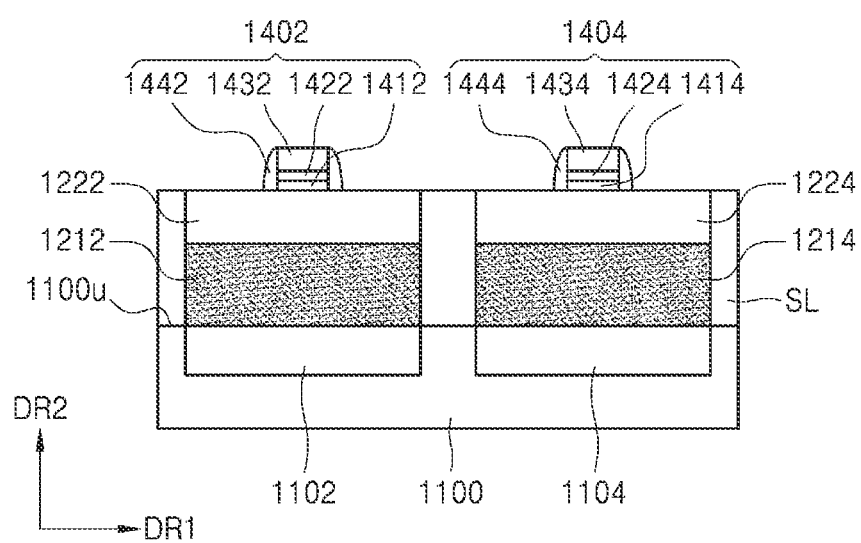

With reference to FIGS. 14 and 22, the first gate structure 1402 and the second gate structure 1404 may be formed on the first channel layer 1222 and the second channel layer 1224, respectively (S280). The first gate structure 1402 may include the first gate ferroelectric film 1412, the first gate dielectric film 1422, the first gate electrode 1432, and the first pair of spacers 1442. Forming the first gate ferroelectric film 1412, the first gate dielectric film 1422, the first gate electrode 1432, and the first pair of spacers 1442 may be substantially identical to the forming of the gate ferroelectric film 310, the gate dielectric film 320, the gate electrode 330, and the pair of spacers 340 described with reference to FIGS. 4 and 9. The second gate structure 1404 may include the second gate ferroelectric film 1414, the second gate dielectric film 1424, the second gate electrode 1434, and the second pair of spacers 1444. Forming the second gate ferroelectric film 1414, the second gate dielectric film 1424, the second gate electrode 1434, and the second pair of spacers 1444 may be substantially identical to the forming of the gate ferroelectric film 310, the gate dielectric film 320, the gate electrode 330, and the pair of spacers 340 described with reference to FIGS. 4 and 9.

With reference to FIGS. 14 and 11, the first pair of source/drain regions SD1 and the second pair of source/drain regions SD2 may be formed in the first channel layer 1222 and the second channel layer 1224, respectively (S290). The forming of the first pair of source/drain regions SD1 and the second pair of source/drain regions SD2 may include a process of doping the first channel layer 1222 and the second channel layer 1224 exposed by the first gate structure 1402 and the second gate structure 1404, respectively. For example, the doping process may include the ion implantation process. The V group elements (e.g., P, As, etc.) may be injected into the first channel layer 1222 exposed by the first gate structure 1402. Accordingly, the first pair of source/drain regions SD1 may have n-type. The III group elements (e.g., B, In, etc.) may be injected into the second channel layer 1224 exposed by the second gate structure 1404. Accordingly, the second pair of source/drain regions SD2 formed in the second channel layer 1224 may have p-type.

According to the present disclosure, a method of manufacturing the ternary inverter 30 having a constant current may be provided.

Figure 23:
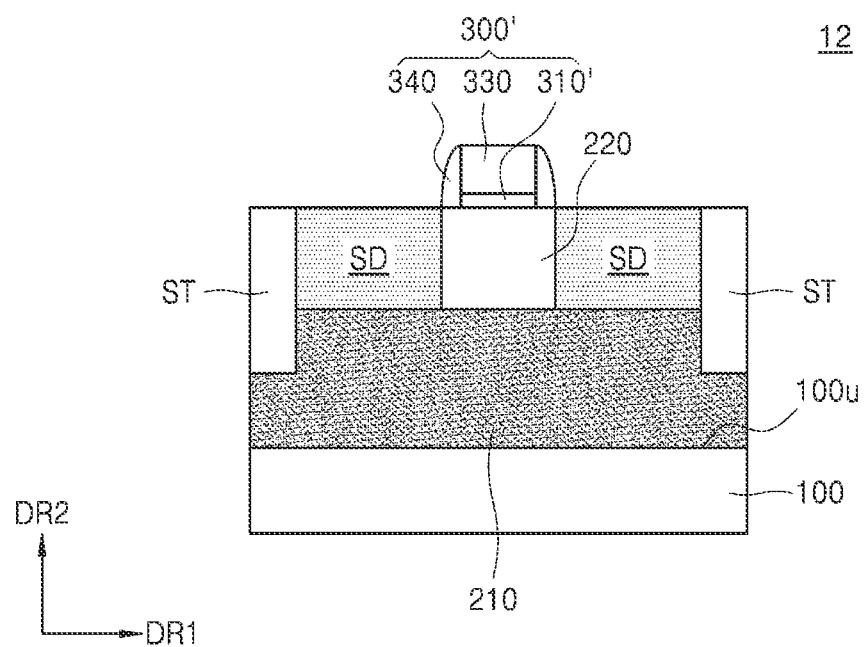
FIG. 23 is a cross-sectional view of a transistor according to example embodiments.

FIG. 23 is a cross-sectional view of a transistor according to example embodiments. For the sake of concise explanation, any description substantially identical to explanations made with reference to FIG. 1 may be omitted.

With reference to FIG. 23, a transistor 12 may be provided. The transistor 12 may include a substrate 100, a constant current formation layer 210, a pair of device isolation regions ST, a pair of source/drain regions SD, a channel layer 220, and a gate structure 300'. The substrate 100, the constant current formation layer 210, the pair of device isolation regions ST, the pair of source/drain regions SD, and the channel layer 220 may be substantially the same as described with reference to FIG. 1.

Unlike the descriptions made with reference to FIG. 1, the gate structure 300' may not include a gate dielectric film 320 of (see FIG. 1). The gate structure 300' may include a gate ferroelectric film 310', a gate electrode 330, and spacers 340. The gate ferroelectric film 310' may have negative capacitance properties. For example, the gate ferroelectric film 310' may include $HfO_2$.

According to the present disclosure, the transistor 12 in which a constant current is formed between the constant current formation layer 210 and one of the pair of source/drain regions SD, which is a drain, may be provided.

The descriptions of embodiments of the technical ideas according to the present disclosure are intended to provide examples to explain the technical ideas of the present disclosure. Accordingly, the technical ideas of the present disclosure are not limited to the embodiments described above, and various modifications and amendments may be made by a person skilled in the art by combining the embodiments, etc., within the scope of the technical ideas of the present disclosure.

The invention claimed is:

1. A transistor comprising:
   a constant current formation layer;
   a channel layer provided on the constant current formation layer;
   a pair of source/drain regions spaced apart from each other, with the channel layer therebetween;
   a gate electrode provided on the channel layer; and
   a gate ferroelectric film provided between the gate electrode and the channel layer,
   wherein an electric field is formed between the constant current formation layer and the source/drain region, which is a drain, of the pair of source/drain regions, and an intensity of the electric field is greater than or equal to $10^6$ V/cm.

2. The transistor of claim 1, further comprising a gate dielectric film provided between the gate electrode and the gate ferroelectric film.

3. The transistor of claim 2, wherein the constant current formation layer forms a constant current between the constant current formation layer and a source/drain region, which is a drain, of the pair of source/drain regions.

4. The transistor of claim 3, wherein the constant current is independent of a gate voltage applied to the gate electrode.

5. The transistor of claim 2, wherein the constant current formation layer and the channel layer have a first conductivity type, and a doping concentration of the constant current formation layer is higher than a doping concentration of the channel layer.

6. The transistor of claim 5, wherein the doping concentration of the constant current formation layer is greater than or equal to $3\times10^{18}$ cm$^{-3}$.

7. A ternary inverter comprising:
a first well region and a second well region;
a first constant current formation layer and a second constant current formation layer provided on the first well region and the second well region, respectively;
a first channel layer and a second channel layer provided on the first constant current formation layer and the second constant current formation layer, respectively;
a first gate structure and a second gate structure provided on the first channel layer and the second channel layer, respectively;
a first pair of source/drain regions spaced apart from each other, with the first channel layer therebetween on the first constant current formation layer; and
a second pair of source/drain regions spaced apart from each other, with the second channel layer therebetween on the second constant current formation layer,
wherein each of the first gate structure and the second gate structure includes a gate ferroelectric film and a gate electrode stacked in this stated order,
wherein an electric field greater than or equal to $10^6$ V/cm is formed between a source/drain region, which is a drain, of the first pair of source/drain regions and the first constant current formation layer, and
an electric field greater than or equal to $10^6$ V/cm is formed between a source/drain region, which is a drain, of the second pair of source/drain regions and the second constant current formation layer.

8. The ternary inverter of claim 7, wherein the first gate structure and the second gate structure respectively further include a gate dielectric film provided between the gate electrode and the gate ferroelectric film.

9. The ternary inverter of claim 8, wherein the first constant current formation layer forms a first constant current between the first constant current formation layer and a source/drain region, which is a drain, of the first pair of source/drain regions, and
the second constant current formation layer forms a second constant current between the second constant current formation layer and a source/drain region, which is a drain, of the second pair of source/drain regions.

10. The ternary inverter of claim 9, wherein the first constant current and the second constant current are independent of gate voltages applied to the gate electrode of the first gate structure and the gate electrode of the second gate structure, respectively.

11. The ternary inverter of claim 8, wherein the first constant current formation layer and the second constant current formation layer have a conductivity type same as that of the first channel layer and the second channel layer, respectively, and
doping concentrations of the first constant current formation layer and the second constant current formation layer are higher than doping concentrations of the first channel layer and the second channel layer, respectively.

12. The ternary inverter of claim 11, wherein the doping concentration of the first constant current formation layer and the doping concentration of the second constant current formation layer are greater than or equal to $3\times10^{18}$ cm$^{-3}$.

* * * * *